(12) United States Patent
Kim

(10) Patent No.: US 6,946,372 B2
(45) Date of Patent: Sep. 20, 2005

(54) METHOD OF MANUFACTURING GALLIUM NITRIDE BASED SEMICONDUCTOR LIGHT EMITTING DEVICE

(75) Inventor: Hyun Kyung Kim, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 37 days.

(21) Appl. No.: 10/861,510

(22) Filed: Jun. 7, 2004

(65) Prior Publication Data

US 2005/0142820 A1    Jun. 30, 2005

(30) Foreign Application Priority Data

Dec. 26, 2003  (KR) .................. 10-2003-0097217

(51) Int. Cl.[7] ............................................. H01L 21/20
(52) U.S. Cl. ................... 438/487; 438/518; 438/519; 438/527; 438/530; 438/47; 257/13; 257/22; 257/76; 257/79
(58) Field of Search ............................. 438/483, 518, 438/519, 527, 530, 47; 257/13, 22, 76

(56) References Cited

U.S. PATENT DOCUMENTS

| | | | |
|---|---|---|---|
| 5,563,422 A | 10/1996 | Nakamura et al. | |
| 6,287,947 B1 * | 9/2001 | Ludowise et al. | 438/606 |
| 2002/0072204 A1 * | 6/2002 | Uemura et al. | 438/483 |
| 2003/0062530 A1 * | 4/2003 | Okazaki et al. | 257/79 |

* cited by examiner

*Primary Examiner*—Matthew Smith
*Assistant Examiner*—Victor V Yevsikov
(74) *Attorney, Agent, or Firm*—Lowe Hauptman & Berner, LLP

(57) ABSTRACT

A method of manufacturing a gallium nitride (GaN)-based semiconductor light emitting device includes forming a contact resistance improved layer on a p-type GaN-based semiconductor layer with at least one metal selected from the group of Au, Mg, Mn, Mo, Pd, Pt, Sn, Ti and Zn, heat-treating the p-type GaN-based semiconductor layer so that elements in the contact resistance improved layer diffuse into the p-type GaN-based semiconductor layer and that Ga elements in the p-type GaN-based semiconductor layer dissolve into the contact resistance improved layer, and removing the contact resistance improved layer remaining on the p-type GaN-based semiconductor layer.

20 Claims, 4 Drawing Sheets

METHOD OF MANUFACTURING GALLIUM NITRIDE BASED SEMICONDUCTOR LIGHT EMITTING DEVICE

BACKGROUND OF THE INVENTION

1. Field of the Invention

The present invention relates to a semiconductor light emitting device, and more particularly to a method of manufacturing a gallium nitride (GaN) based semiconductor light emitting device, which ensures a high brightness while lowering a contact resistance near a surface formed with a p-side electrode.

2. Description of the Related Art

In general, a gallium nitride-based semiconductor is used for a light emitting diode for emitting light in a wavelength range of a blue light or a green light and usually comprises semiconductor materials with the formula $Al_xIn_yGa_{(1-x-y)}N$ (where $0 \leq x \leq 1$, $0 \leq y \leq 1$, $0 \leq x+y \leq 1$). As for the light emitting device generating a green light, a gallium nitride (GaN) semiconductor material with a large energy band gap of about 3.4 eV is usually used.

As the GaN-based semiconductor generally has a large energy band gap, there is a difficulty in achieving an ohmic contact with an electrode thereon. Specifically, a p-type clad layer to be formed with a p-side electrode has a large contact resistance, causing a problem of raising operating voltage of the device and amount of heat.

Conventionally, as for a method for overcoming the problem for the ohmic contact, various methods have been suggested. However, since an ohmic contact portion is provided as a primary light emitting plane, it is needed to satisfy a requirement of ensuring a transmission of light generated from an active layer through the light emitting plane. Thus, only a few methods could be restrictively adopted in practice as a method for lowering the contact resistance.

As a conventional method, U.S. Pat. No. 5,563,422 entitled "Nitride gallium-based III–IV compound semiconductor device and method of producing the same," which is assigned to Nichia Chemical Industry Limited, discloses a transparent electrode using a bi-layer of Ni-Au. FIG. 1 shows a light emitting device according to an embodiment of U.S. Pat. No. 5,563,422.

As shown in FIG. 1, a gallium nitride-based semiconductor light emitting device 10 of the prior art comprises an n-type GaN semiconductor layer 13 formed on the substrate 11, a GaN/InGaN active layer 15 having a multi-well structure and a p-type GaN semiconductor layer 17. An n-side electrode 19a is formed on the n-type GaN semiconductor layer 13, which has a portion of the p-type GaN semiconductor layer 17 and GaN/InGaN active layer 15 removed. A transparent electrode 18 and a p-side electrode 19b are sequentially laminated with Ni and Au on the p-type GaN semiconductor layer 17. The transparent electrode 18 is a translucent layer for improving the contact resistance and forms the ohmic contact through a deposition process for Ni/Au and a subsequent heat treatment.

It is desirable that the transparent electrode 18 is formed as thick as possible in order to improve current injection efficiency. However, as the transparent electrode 18 is formed of metals, it could be difficult for the transparent electrode to have a desired translucency. Even though a NiO layer of a relatively high translucency is formed through the heat treatment, it has a transmittance of merely 60%, so that light emitting efficiency can be deteriorated as the transparent electrode thickens.

Thus, the transparent electrode should be limited to a thickness of 100 μm or less, causing a restriction in improving the current injection efficiency.

Further, even though the transparent electrode of the metals has a proper thickness in consideration of a desired transmittance, it inevitably encounters some reduction in brightness due to a restrictive transmittance in the transparent electrode that is made of the metals having a high photon absorption rate, such as Au.

SUMMARY OF THE INVENTION

The present invention has been made to solve the above problems, and it is an object of the present invention to provide a new method of manufacturing a light emitting diode, which prevents a deterioration in brightness while lowering a contact resistance by removing residual metallic materials after a deposition process of selected metallic materials and heat treatment, in order to lower the contact resistance at a p-type gallium nitride-based semiconductor layer formed with a p-type electrode.

In accordance with an aspect of the present invention, the above and other objects can be accomplished by the provision of a method of manufacturing a gallium nitride (GaN)-based semiconductor light emitting device, comprising the steps of: a) forming an n-type GaN-based semiconductor layer, an active layer and a p-type GaN-based semiconductor layer on a substrate for growing a GaN-based semiconductor, sequentially; b) forming a contact resistance improved layer on the p-type GaN-based semiconductor layer with at least one metal selected from the group of Au, Mg, Mn, Mo, Pd, Pt, Sn, Ti and Zn; c) heat-treating the p-type GaN-based semiconductor layer formed with the contact resistance improved layer, so that elements in the contact resistance improved layer diffuse into the p-type GaN-based semiconductor layer and that Ga elements in the p-type GaN-based semiconductor layer dissolve into the contact resistance improved layer; d) removing the contact resistance improved layer remaining on the p-type GaN-based semiconductor layer; and e) forming a p-side electrode and an n-side electrode connected with the p-type GaN-based semiconductor layer and the contact resistance improved layer, respectively.

The step c) may be carried out at a temperature of about 400° C. ~800° C. under an oxygen atmosphere.

The method of the present invention may further comprise the step f) of forming a nickel (Ni) layer on the contact resistance improved layer before the step c), and the step d) may comprise the step of removing the Ni layer and the remaining contact resistance improved layer from the surface of the p-type GaN-based semiconductor layer.

The Ni layer may have a thickness of at least about 20 Å, and the contact resistance improved layer may comprise a layer of Au. When using the Au layer as the contact resistance improved layer, the Au layer may have a thickness of about 20 Å~100 Å.

The method of the present invention may further comprise the step f) of forming a nickel (Ni) layer on the p-type GaN-based semiconductor layer before the step b), and the step d) may comprise the step of removing the Ni layer and the remaining contact resistance improved layer from the surface of the p-type GaN-based semiconductor layer.

The Ni layer may have a thickness of about 20 Å~80 Å. Further, the contact resistance improved layer may comprise a layer of Au, and in this case, the Au layer may have a thickness of about 20 Å.

The step d) may comprise the step of wet-etching the contact resistance improved layer so that the contact resistance improved layer is removed from the surface of the p-type GaN-based semiconductor layer, and more preferably the step d) may be carried out using a hydrofluoric acid-based etchant.

A p-side electrode, which can be formed on the p-type gallium nitride-based semiconductor layer reformed according to the present invention, may comprise at least one layer of materials selected from the group of Ni, Pd, Ir, Ru, Mg, Zn, Ag, ITO, ZnO and Pt. That is, the p-side electrode of the present invention may be formed of various materials and constructions (single layer or multi-layer), as is needed, and the p-side electrode and the n-side electrode may be formed of the same materials, so that these electrodes may be formed by an identical process.

BRIEF DESCRIPTION OF THE DRAWINGS

The foregoing and other objects and features of the present invention will be more clearly understood from the following detailed description taken in conjunction with the accompanying drawings, in which.

DESCRIPTION OF THE PREFERRED EMBODIMENTS

Preferred embodiments will now be described in detail with reference to the accompanying drawings.

Figure 1:
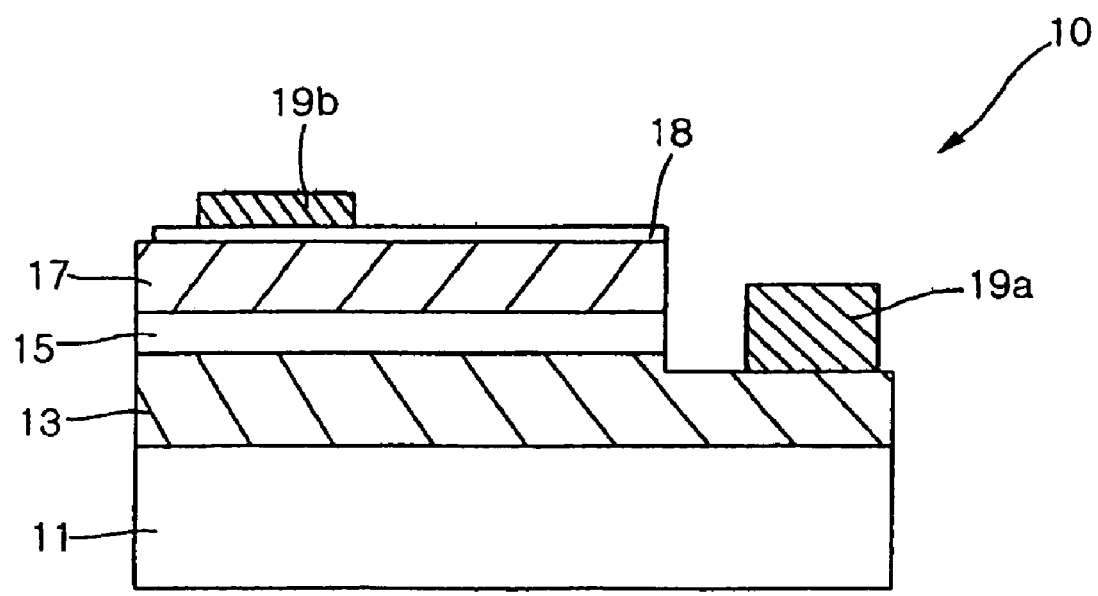
FIG. 1 is a side-sectional view showing a conventional gallium nitride based semiconductor light emitting device.
Figure 2:
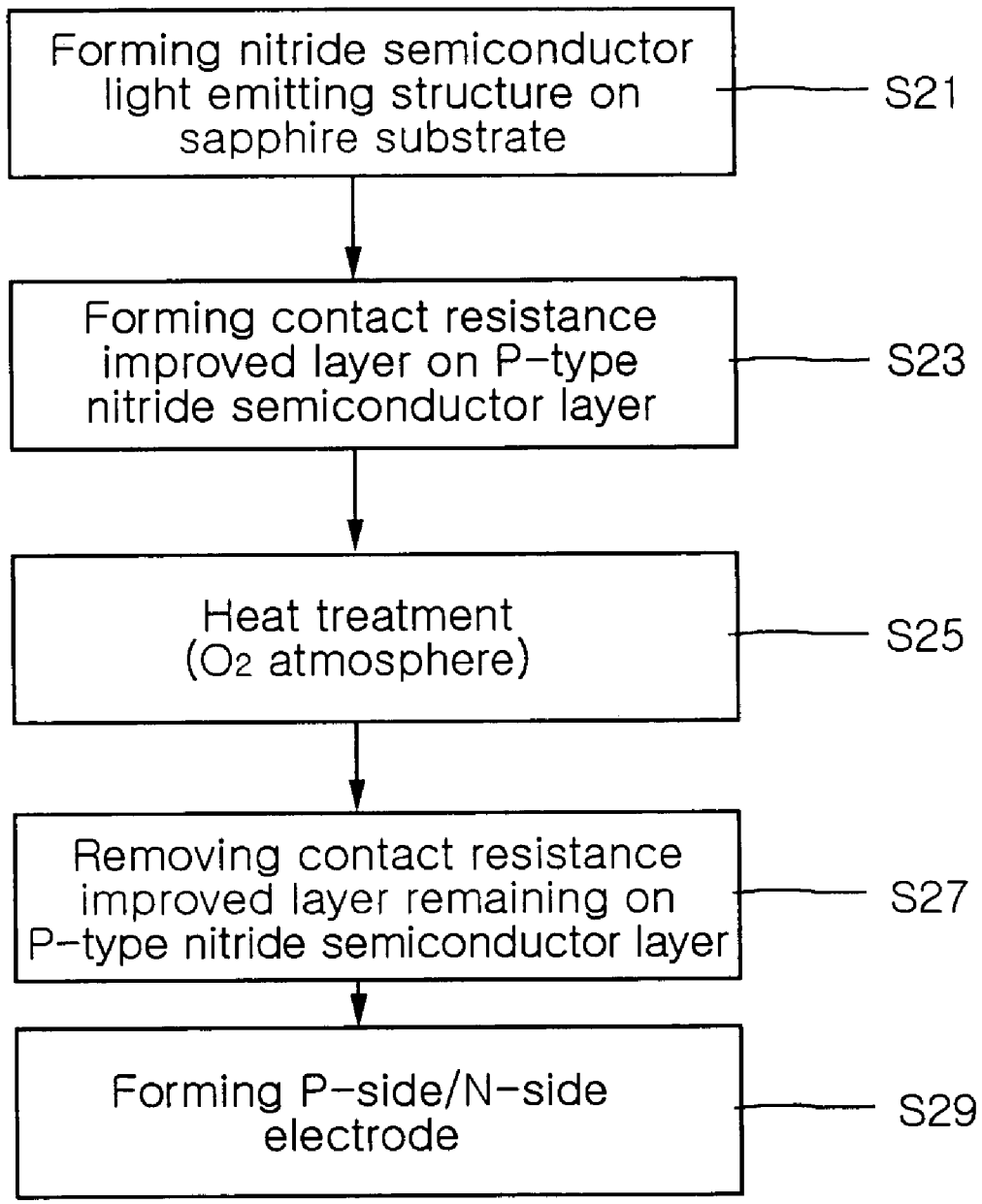
FIG. 2 is a flow chart illustrating a method of manufacturing a gallium nitride-based semiconductor light emitting device according to the present invention.

FIG. 2 is a flow chart illustrating a method of manufacturing a gallium nitride-based light emitting device according to the present invention.

As shown in FIG. 2, the method of the present invention starts from step S21, at which an n-type GaN-based semiconductor layer, an active layer and a p-type GaN-based semiconductor layer are sequentially formed on a substrate for growing a gallium nitride (GaN)-based semiconductor. As for a substrate for growing a gallium nitride-based semiconductor, a similar GaN substrate, a SiC substrate or a sapphire substrate can be employed, among which the sapphire substrate is generally used.

Subsequently, at step S23, a contact resistance improved layer is deposited on the p-type GaN-based semiconductor layer. The contact resistance improved layer is a layer for lowering a contact resistance at the surface of the p-type GaN-based semiconductor layer, that is, at a region to be formed with a p-side electrode. This layer can be formed through depositing at least one metal selected from the group of Au, Mg, Mn, Mo, Pd, Pt, Sn, Ti and Zn thereon.

At step S25, the p-type GaN-based semiconductor layer formed with the contact resistance improved layer is subjected to heat treatment. During the heat treatment, the metallic elements in the contact resistance improved layer diffuse into the p-type GaN-based semiconductor layer, while Ga elements in the p-type GaN-based semiconductor layer dissolve into the contact resistance improved layer, forming Ga vacancies in the p-type GaN-based semiconductor layer. The heat treatment, which is applied to improve conductivity near the surface of the p-type GaN-based semiconductor layer, is preferably carried out at a temperature of about 400~800° C. under an oxygen atmosphere.

As such, near the surface of the p-type GaN-based semiconductor layer, the contact resistance can be reduced due to the Ga vacancies formed by the dissolving of the Ga elements into the contact resistance improved layer. Particularly, the Ga vacancies formed near the surface of the p-type GaN-based semiconductor layer have a high activity, unlike that (merely about 1%) of a typical Mg dopant, and can significantly increase hole carriers.

Next, at step S27, the contact resistance improved layer remaining on the p-type GaN-based semiconductor layer is removed. Different from the conventional method, the present invention employs a process of lowering the contact resistance by increasing the number of carriers near the surface of the p-type GaN-based semiconductor layer, not by forming a translucent conduction layer (that is, transparent electrode as described above) for lowering the contact resistance. As a result, the contact resistance improved layer of the invention has a problem of deterioration in transparency after the heat treatment. Thus, in order to solve the problem, the process of removing the remaining contact resistance improved layer is carried out after the heat treatment.

Lastly, at step S29, a p-side electrode and an n-side electrode are formed, and these electrodes are connected with the p-type GaN-based semiconductor layer and the contact resistance improved layer, respectively. The electrodes of the present invention, particularly the p-side electrode, may comprise a single layer or multi-layers, which may comprise materials selected from the group of Ni, Pd, Ir, Ru, Mg, Zn, Ag, ITO, ZnO and Pt. Further, the p-side electrode can be formed of a material, the same as that of the n-side electrode, so that these electrodes may be formed at the same time by one identical process. As described above, in order to lower the contact resistance, the present invention adopts not a method of modifying a construction of the p-side electrode, but a method of reforming the surface of the p-type GaN-based semiconductor layer, thereby providing a benefit that more various constructions and materials can be adopted for the electrodes.

FIGS. 3a to 3e are cross-sectional views of a flow diagram illustrating the method of manufacturing the gallium nitride-based light emitting device according to a preferred embodiment of the present invention.

Figure 3A:
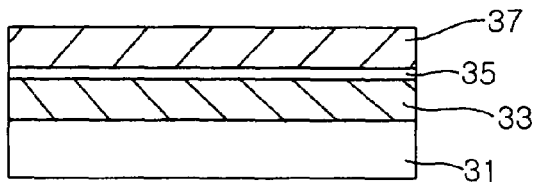
FIGS. 3a to 3e are schematic cross-sectional views illustrating respective processes of the method of manufacturing the gallium nitride-based semiconductor light emitting device according to an embodiment of the present invention.

First, as shown in FIG. 3a, an n-type GaN-based semiconductor layer 33, an active layer 35 and a p-type GaN-based semiconductor layer 37 are sequentially formed on a substrate 31. The GaN-based semiconductor layers 31, 33 and 35 may consist of semiconductor materials with the formula $Al_xIn_yGa_{(1-x-y)}N$ (where $0 \leq x \leq 1$, $0 \leq y \leq 1$, $0 \leq x+y \leq 1$).

Figure 3B:
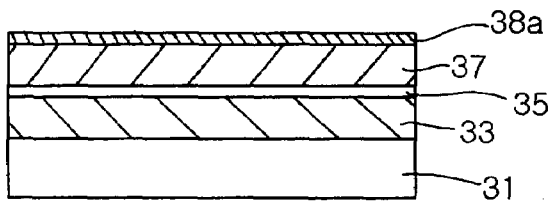

Subsequently, as shown in FIG. 3b, an Au layer 38a is deposited on the p-type GaN-based semiconductor layer 37. The Au layer 38a is prepared as a means for enhancing conductivity with an increase of the carriers capable of being activated near the surface of the p-type GaN-based semiconductor layer by a subsequent heat treatment. In addition to Au, the layer can be formed by deposition with Mg, Mn, Mo, Pd, Pt, Sn, Ti, Zn or alloys thereof, and most preferably with Au. Preferably, the Au layer 38a has a thickness of about 20 Å or more. Further, according to the embodiment, when a Ni layer 38b in FIG. 3c on the Au layer 38a is formed, the Au layer 38a preferably has a thickness of about 100 Å or less in order to prevent a reduction in adherent force.

Figure 3C:
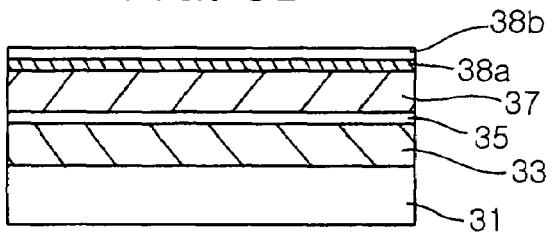

Then, as shown in FIG. 3c, a nickel (Ni) layer 38b is formed on the Au layer 38a. Different from the Au layer 38a increasing the carriers near the surface of the p-type GaN-based semiconductor layer 37 with the Ga vacancies formed by the dissolving of the Ga elements, the Ni layer 38b is used as a layer for preventing loss of p-type dopant, such as Mg of the p-type GaN-based semiconductor layer, in the following heat treatment process. The Ni layer 38b should have a thickness of at least about 20 Å in order to achieve an effect of preventing the loss of p-type dopant.

Figure 3D:
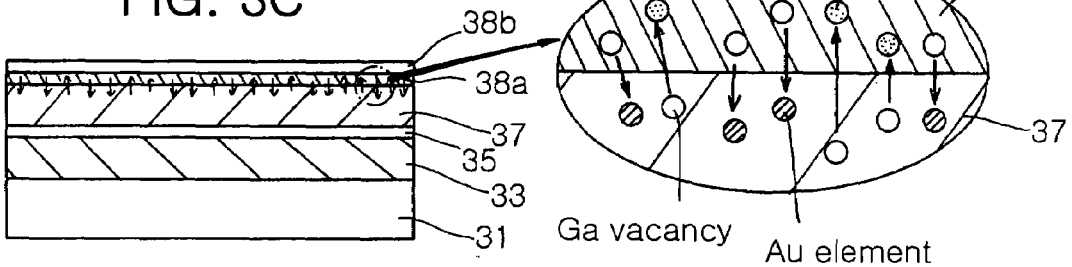

Next, as shown in FIG. 3d, the p-type GaN-based semiconductor layer 37 formed with the Au layer 38a and the Ni layer 38b is subjected to heat treatment. The heat treatment may be carried out at a temperature of about 400~800° C. under an oxygen atmosphere. During the heat treatment, a reaction occurs such that concentration of the carriers near the p-type GaN-based semiconductor layer 37 significantly increases. That is, as shown in FIG. 3d, concurrently with a diffusion of Au elements into the p-type GaN-based semiconductor layer 37, Ga elements in the p-type GaN-based semiconductor layer 37 dissolve into the Au layer 38a, so that Ga vacancies are provided in the p-type GaN-based semiconductor layer 37. The vacancies act as the hole-carriers with a higher activity on the surface of the p-type GaN-based semiconductor layer 37, so that the contact resistance of the p-type GaN-based semiconductor layer 37 can be considerably reduced.

Figure 3E:
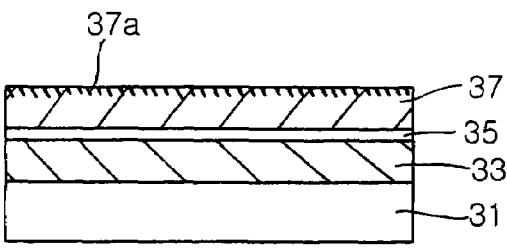

Next, as shown in FIG. 3e, the Au layer and the Ni layer remaining on the p-type GaN-based semiconductor layer are removed. This step is carried out with a wet-etching process, preferably using a hydrofluoric acid-based etchant. After removing the Au layer 38a being the contact resistance improved layer of the present invention, a highly conductive area 37a is formed on at least a portion of the p-type GaN-based semiconductor layer, that is, near the surface thereof. The highly conductive area 37a has an increased carrier concentration due to the Ga vacancies and the diffused Au, resulting in a considerable reduction in contact resistance.

As such, in accordance with the present invention, the conductivity of the p-type GaN semiconductor layer itself is enhanced, whereby even though the remaining Au layer or Ni layer is removed, not only the contact resistance can be improved, but also the problem of the reduction in transmittance caused by the remaining Au layer or Ni layer can be solved.

Different from the embodiment as shown in FIGS. 3a to 3e, the present invention can also be embodied by forming the Au layer as the contact resistance improved layer after forming the Ni layer on the p-type GaN-based semiconductor layer. According to this embodiment, during the heat treatment, the Ni layer is transformed into a $NiO_2$ film, through which the Au layer and the p-type GaN-based semiconductor layer can react with each other. In order to provide this reaction, when forming the Ni layer at first, the Ni layer preferably has a thickness of 20 Å ~80 Å. The Au layer preferably has a thickness of at least 20 Å.

Additionally, the light emitting structure as shown in FIG. 3e can be produced into a desired light emitting device by mesa-etching a predetermined portion of the p-type GaN-based semiconductor layer and active layer, and then by forming an n-side electrode and a p-side electrode on an exposed surface of the n-type GaN-based semiconductor layer and on the p-type GaN-based semiconductor layer, respectively. The p-side electrode of the present invention may comprise at least one material selected from the group of Ni, Pd, Ir, Ru, Mg, Zn, Ag, ITO, ZnO and Pt, and comprise a single layer or multi-layers. Since the present invention solves the problem of contact resistance on the p-type GaN semiconductor layer not by using the materials and/or the constructions of the p-side electrode, but by reforming the surface itself of the p-type GaN semiconductor layer to ensure a higher conductivity, the p-side electrode can be variously constituted.

Figure 4A:
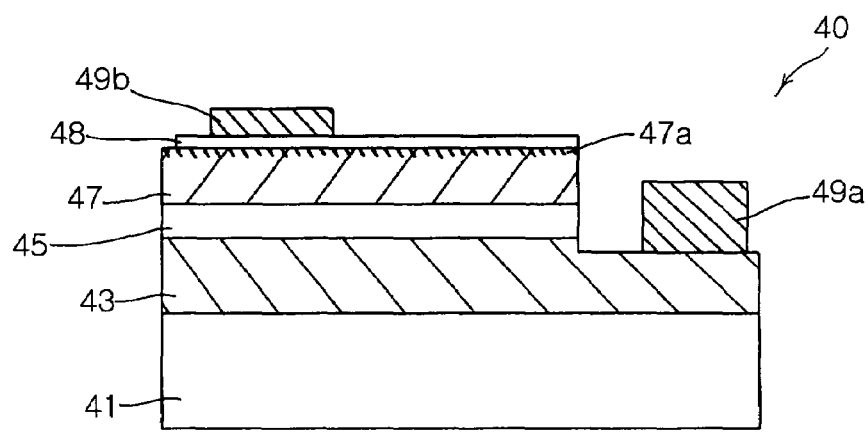
FIGS. 4a and 4b are cross-sectional views of a gallium nitride-based light emitting device manufactured by the method of the present invention and an example of an application package thereof, respectively.

An example of the resultant gallium nitride-based semiconductor light emitting device is shown in FIG. 4a.

Referring to FIG. 4a, a gallium nitride-based semiconductor light emitting device 40 comprises an n-type GaN semiconductor layer 43 formed on a sapphire substrate 41, a GaN/InGaN active layer 45 having a multi-well structure and a p-type GaN semiconductor layer 47. An n-side electrode 49a is formed on the surface of the n-type GaN semiconductor layer 43 on which a portion of the GaN/InGaN active layer 45 and p-type GaN semiconductor layer 47 is removed. Highly conductive areas 47a with a high carrier concentration are formed on the p-type GaN semiconductor layer 47 with a contact resistance improved layer, such as the Au layer, according to the present invention. After removing metals of a high photon absorption rate, such as the Au layer, remaining on the p-type GaN semiconductor layer 47, a p-side electrode is prepared by additionally forming a highly reflective metal layer 48 made of Ni/Ag or Pd/Ag which has a high reflectance, and then by forming a p-side bonding electrode 49b.

Figure 4B:
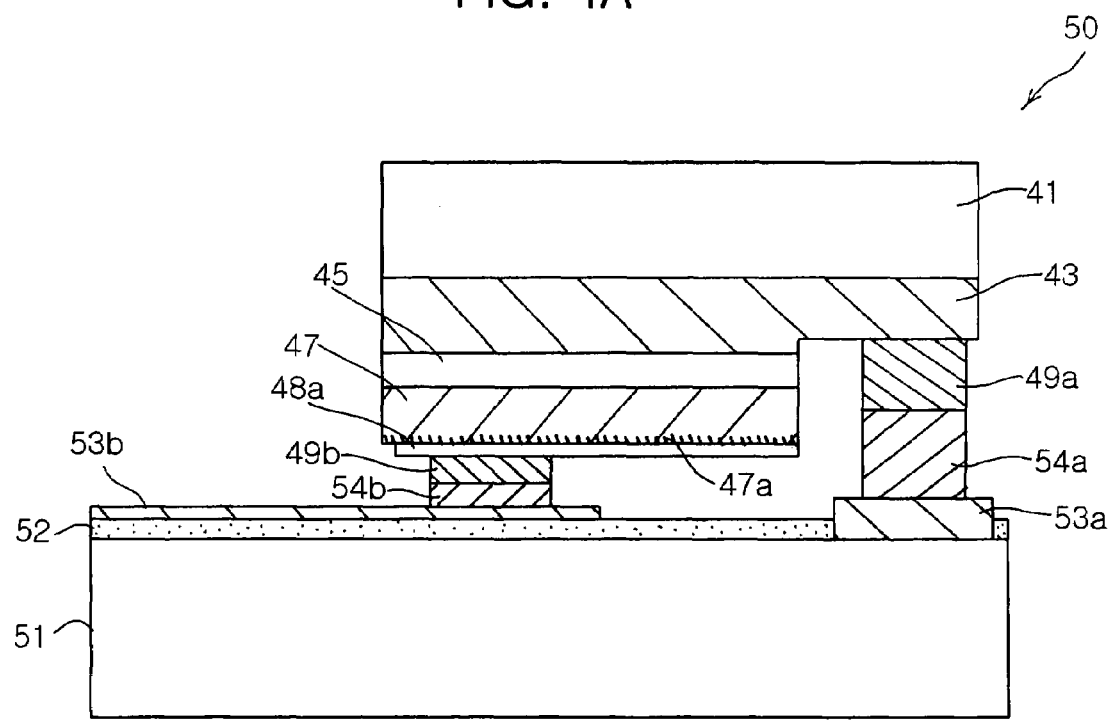

The gallium nitride-based semiconductor light emitting device 40 including the highly reflective metal layer 48 can be usefully applied to a light emitting package with a flip-chip bonding structure as shown in FIG. 4b.

Referring to FIG. 4b, the light emitting device 40 in FIG. 4a is disposed on a conductive silicone substrate 51. A first conduction pattern 53a and a second conduction pattern 53b are formed on the silicone substrate 51 with a separation of a dielectric layer 52. A p-side electrode and an n-side electrode of the light emitting device 40 are connected with the first and the second conductive patterns 53a and 53b via conductive bumps 54a and 54b, respectively.

As can be understood from the illustrations of FIGS. 4a and 4b, in accordance with the present invention, the flip-chip structure shown in FIG. 4b can avoid an increase of a forward voltage without the Au layer of the high absorption rate by providing a desired ohmic contact while adding layers of a high reflectance on the p-side electrode construction. That is, the method of lowering the contact resistance in the p-type gallium nitride-based semiconductor layers has a benefit of variously selecting the materials and the constructions of the p-side electrode, as is needed.

As apparent from the above description, in accordance with the present invention, areas of the electrodes on the p-type gallium nitride-based semiconductor layers can be formed as the highly conductive area by depositing the contact resistance improved layer with metals, such as Au, on the area of the p-type gallium nitride-based semiconductor to be formed with the p-side electrode, and then by heat-treating the contact resistance improved layer. Further, the contact resistance is lowered by reforming the p-type gallium nitride-based semiconductor layer itself, which removes a requirement for an additional layer, such as the transparent layer, thereby preventing a reduction in brightness due to the added layer. Further, depending on the requirements of the users and the resultant package structure, there is provided another advantageous effect that the materials and the constructions of the p-side electrode can be variously modified.

It should be understood that the embodiments and the accompanying drawings as described above have been described for illustrative purposes and the present invention is limited by the following claims. Further, those skilled in the art will appreciate that various modifications, additions and substitutions are allowed without departing from the scope and spirit of the invention as set forth in the accompanying claims.

What is claimed is:

1. A method of manufacturing a gallium nitride (GaN)-based semiconductor light emitting device, said method comprising the steps of:
   a) sequentially forming an n-type GaN-based semiconductor layer, an active layer and a p-type GaN-based semiconductor layer on a substrate;
   b) forming a contact resistance improving layer on the p-type GaN-based semiconductor layer from at least one metal selected from the group consisting of Au, Mn, Mo, Pd, Pt, Sn, and Ti;
   c) heat-treating the p-type GaN-based semiconductor layer and the contact resistance improving layer, so that atoms of said at least one metal in the contact resistance improving layer diffuse into the p-type GaN-based semiconductor layer and Ga atoms in the p-type GaN-based semiconductor layer dissolve into the contact resistance improving layer;
   d) removing the contact resistance improving layer from the p-type GaN-based semiconductor layer; and
   e) forming a p-side electrode and an n-side electrode connected with the p-type GaN-based semiconductor layer and the n-type GaN-based semiconductor layer, respectively.

2. The method as set forth in claim 1, wherein step c) is carried out at a temperature of about 400° C.~800° C. in an oxygen atmosphere.

3. The method as set forth in claim 1, further comprising the step of:
   f) forming a nickel (Ni) layer on the p-type (iaN-based semiconductor layer before step b);
   wherein step d) comprises removing both the remaining contact resistance improving layer and the Ni layer from the p-type GaN-based semiconductor layer.

4. The method as set forth in claim 3, wherein the Ni layer has a thickness of about 20 Å~80 Å.

5. The method as set forth in claim 3, wherein the contact resistance improving layer comprises a layer of Au.

6. The method as set forth in claim 5, wherein the Au layer may have a thickness of about 20 Å.

7. The method as set forth in claim 3, wherein the Ni layer is sandwiched between the p-type GaN-based semiconductor layer and the contact resistance improving layer.

8. The method as set forth in claim 3, wherein step d) comprises removing both the contact resistance improving layer and the Ni layer entirely from the p-type GaN-based semiconductor layer.

9. The method as set forth in claim 1, wherein step d) comprises wet-etching the contact resistance improving layer so that the contact resistance improving layer is removed from the p-type GaN-based semiconductor layer.

10. The method as set forth in claim 9, wherein the wet etching is carried out using a hydrofluoric acid-based etchant.

11. The method as set forth in claim 1, wherein the p-side electrode comprises at least one layer of materials selected from the group consisting of Ni, Pd, Ir, Ru, Ag, ITO, ZnO and Pt.

12. The method as set forth in claim 1, wherein the p-side electrode and the n-side electrode are formed of the same materials.

13. The method as set forth in claim 1, wherein said heat-treating step is performed until an amount of hole-carriers, caused by the Ga atoms dissolving into the contact resistance improving layer, in a surface region of the p-type GaN-based semiconductor layer adjacent said contact resistance improving layer has increased to a level sufficient to give said surface region of said p-type GaN-based semiconductor layer a desired contact resistance.

14. The method as set forth in claim 1, wherein the contact resistance improving layer is formed from at least one metal selected from the group consisting of Mn, Mo, Sn, and Ti.

15. A method of manufacturing a gallium nitride (GaN)-based semiconductor light emitting device, said method comprising the steps of:
   a) sequentially forming an n-type GaN-based semiconductor layer, an active layer and a p-type GaN-based semiconductor layer on a substrate for growing a GaN-based semiconductor;
   b) forming a contact resistance improving layer on the p-type GaN-based semiconductor layer from at least one metal selected from the group consisting of Au, Mg, Mn, Mo, Pd, Pt, Sn, Ti and Zn;
   c) heat-treating the p-type GaN-based semiconductor layer and the contact resistance improving layer, so that atoms of said at least one metal in the contact resistance improving layer diffuse into the p-type GaN-based semiconductor layer and Ga atoms in the p-type GaN-based semiconductor layer dissolve into the contact resistance improving layer;
   d) removing the contact resistance improving layer from the p-type GaN-based semiconductor layer; and
   e) forming a p-side electrode and an n-side electrode connected with the p-type GaN-based semiconductor layer and the n-type GaN-based semiconductor layer, respectively;
   said method further comprising the step of:
   f) forming a nickel (Ni) layer on the contact resistance improving layer before step c);
   wherein step d) comprises of removing both the remaining contact resistance improving layer and the Ni layer from the p-type GaN-based semiconductor layer.

16. The device as set forth in claim 15, wherein the Ni layer has a thickness of at least about 20 Å.

17. The method as set forth in claim 15, wherein the contact resistance improving layer comprises a layer of Au.

18. The method as set forth in claim 17, wherein the Au layer has a thickness of about 20 Å~100 Å.

19. The method as set forth in claim 15, wherein step d) comprises removing both the contact resistance improving layer and the Ni layer entirely from the p-type GaN-based semiconductor layer.

20. A method of manufacturing a gallium nitride (GaN)-based semiconductor light emitting device, said method comprising the steps of:
   a) sequentially forming an n-type GaN-based semiconductor layer, an active layer and a p-type GaN-based semiconductor layer on a substrate for growing a GaN-based semiconductor;
   b) forming a contact resistance improving, layer on the p-type GaN-based semiconductor layer from at least one metal selected from the group consisting of Au, Mg, Mn, Mo, Pd, Pt, Sn, Ti and Zn;

c) heat-treating the p-type GaN-based semiconductor layer and the contact resistance improving layer, so that atoms of said at least one metal in the contact resistance improving layer diffuse into the p-type GaN-based semiconductor layer and Ga atoms in the p-type GaN-based semiconductor layer dissolve into the contact resistance improving layer;

d) removing the contact resistance improving layer from the p-type GaN-based semiconductor layer; and e) forming a p-side electrode and an n-side electrode connected with the p-type GaN-based semiconductor layer and the n-type GaN-based semiconductor layer, respectively, wherein the p-side electrode and the n-side electrode are formed of the same materials.

* * * * *